United States Patent [19]

Greenberg et al.

[11] Patent Number: 5,485,112

[45] Date of Patent: Jan. 16, 1996

[54] METASTABLE TOLERANT LATACH

[75] Inventors: Craig B. Greenberg, Rowlett; Jay A. Maxey; Kevin M. Ovens, both of Garland, all of Tex.

[73] Assignee: Texas Instruments Incorporated, Dallas, Tex.

[21] Appl. No.: 278,715

[22] Filed: Jul. 28, 1994

Related U.S. Application Data

[63] Continuation of Ser. No. 95,364, Jul. 20, 1993, abandoned, which is a continuation of Ser. No. 876,820, Apr. 29, 1992, abandoned, which is a continuation of Ser. No. 800,710, Dec. 2, 1991, abandoned, which is a continuation of Ser. No. 653,861, Feb. 8, 1991, abandoned, which is a continuation of Ser. No. 288,545, Dec. 21, 1988, abandoned.

[51] Int. Cl.$^6$ .................................................. H03K 3/286
[52] U.S. Cl. .................. 372/198; 327/202; 327/215; 327/219; 327/327; 327/379; 327/482
[58] Field of Search .............................. 326/21, 93, 126; 327/198, 202, 212, 215, 218, 219, 309, 312, 313, 321, 327, 379, 387, 478, 482; 307/272.2, 291, 443, 481, 542, 546, 557, 558, 292, 272.3, 272.1, 290, 572; 328/206

[56] References Cited

U.S. PATENT DOCUMENTS

| 3,292,014 | 12/1966 | Brooksby | 307/206 |
|---|---|---|---|
| 3,474,263 | 8/1969 | Kalb | 307/289 |
| 3,558,931 | 1/1971 | Chernoske | 307/291 |
| 3,591,856 | 7/1971 | Kalb | 307/456 |
| 3,796,831 | 3/1974 | Bauer | 307/234 |
| 3,835,336 | 9/1974 | Block | 307/234 |
| 3,849,673 | 11/1974 | Koo | 307/530 |
| 3,971,960 | 7/1976 | Means et al. | 307/289 |
| 4,093,878 | 6/1978 | Paschal et al. | 307/291 |
| 4,150,392 | 4/1979 | Nonaka | 307/272.2 |
| 4,233,525 | 11/1980 | Kakahashi et al. | 307/234 |
| 4,491,745 | 1/1985 | Birch | 307/272.2 |
| 4,517,475 | 5/1985 | Petty | 307/272.2 |
| 4,578,599 | 3/1986 | Birch et al. | 307/291 |
| 4,583,008 | 4/1986 | Grugett | 307/443 |
| 4,591,737 | 12/1986 | Campbell | 307/291 |
| 4,622,475 | 11/1987 | Whiteley | 307/530 |
| 4,710,648 | 12/1987 | Hanamura et al. | 307/451 |
| 4,719,366 | 1/1988 | Tan | 307/272.2 |
| 4,777,388 | 10/1988 | Widener | 307/272.2 |
| 4,800,296 | 1/1989 | Ovens et al. | 307/443 |
| 4,820,939 | 4/1989 | Sowell et al. | 307/269 |
| 4,855,617 | 8/1989 | Ovens | 307/272.2 |
| 4,881,041 | 11/1989 | Kawanabe et al. | 307/234 |
| 4,883,985 | 11/1989 | Katsu et al. | 307/291 |
| 4,929,850 | 5/1990 | Breuninger | 307/272.1 |

FOREIGN PATENT DOCUMENTS

| 0029057 | 3/1978 | Japan | 307/272.2 |
|---|---|---|---|
| 0044228 | 3/1980 | Japan . | |
| 0032824 | 4/1981 | Japan | 307/443 |
| 0202819 | 9/1985 | Japan | 307/471 |
| 0230714 | 11/1985 | Japan | 307/272.2 |

OTHER PUBLICATIONS

IBM Tech. Discl. Bultn., vol. 32 No. 4B, "Fast Setting Master–Slave Data Bus Using Depletion Load Master–to–Slave Coupling", pp. 198–199, Sep. 1989.

Mead and Conway; "Introcuction to VLSI Systems"; 10–80; pp. 236–242.

"Cross–Coupled Front End Master–Slave Flip–Flop", IBM Technical Disclosure Bulletin, vol. 28 No. 2 Jul. 1985, pp. 733–734.

*Primary Examiner*—Terry D. Cunningham
*Attorney, Agent, or Firm*—Ronald O. Neerings; James C. Kesterson; Richard L. Donaldson

[57] ABSTRACT

A flip-flop having a master section including two switching transistors is provided with output loading transistors to drive the two transistors into saturation in the event of a metastable condition causing input is present. By driving the switching transistors into saturation they become inactive and background noise cannot cause proprogation of the metastable condition to subsequent flip-flip stages.

17 Claims, 3 Drawing Sheets

METASTABLE TOLERATCH LATACH

This application is a continuation of application Ser. No. 08/095,364, filed Jul. 20, 1993, now abandoned; which is a continuation of Ser. No. 07/876,820, filed Apr. 29, 1992 now abandoned; which is a continuation of Ser. No. 07/800,710 filed Dec. 2, 1991 now abandoned which is a continuation of application Ser. No. 07/653,861 filed Feb. 8, 1991 now abandoned which is a continuation of application Ser. No. 07/288,545 filed Dec. 21, 1988 now abandoned.

BACKGROUND OF THE INVENTION

I. Field of the Invention.

The present invention relates generally to latches and flip-flops, and more particularly relates to a flip-flop capable of suppressing and compensating for metastable conditions.

II. Description of the Related Art.

Flip-flops are often used by system designers to synchronize signals operating at different frequencies to a local clock. However, since the signals are asynchronous to the local clock, the setup and hold time specifications associated with the flip-flop are sure to be violated. When the setup and hold time is violated, the output response of the flip-flop is uncertain. The output may assume a "metastable" state, defined as the time period during which the output of a digital logic device is not at logic level 1 or logic level 0, but instead resides at an output level between logic level 0 and logic level 1. The voltage ranges corresponding to different logic levels are specified by the manufacturer of the device. For bipolar TTL technology, for example, the metastable region might lie between 0.8 volts and 2.0 volts.

The metastable problem occurs when the signal being input to the flip-flop is undergoing a transition from one logic level to the other simultaneously with the active edge of the local clock pulse, causing the latch section of the flip-flop to latch at an intermediate voltage level. Since the input data is changing while it is being clocked, the system designer does not care if the flip-flop goes to either a high or low logic level in this instance, just so long as the output does not "hang-up" in the metastable region. Neither level would be valid since the setup and hold was violated; so the actual result in this case is immaterial. Eventually, the output of the flip-flop will stabilize at a valid logic level; however, logic circuitry following the flip-flop depends upon the delay specification (stated time period from the clock pulse to a valid output) being met. A metastable output may cause this logic circuitry to fail. Thus, the metastable characteristics of the flip-flop used to synchronize an asynchronous data stream can influence overall system reliability.

Therefore, a need has arisen for a flip-flop which corrects for metastable output conditions.

SUMMARY OF THE INVENTION

In accordance with the present invention, the disclosed flip-flop suppresses and effectively compensates for the occurrence of metastable phenomena. Briefly, according to the present invention, the present flip-flop comprises an input for receiving signals; first and second cross coupled transistors, each being responsive to the input signals to provide a logical high or low collector output voltage; and means for clamping the outputs at a desired output potential in response to concurrent conduction of the cress coupled transistors. In a preferred embodiment the means may comprise output terminals loading terminals transistors coupled to the outputs to ensure clamping of the cross coupled transistors. In a still further embodiment these transistors may be schottky transistors.

Output glitch removal or suppressing circuitry may be added to the present invention to enhance its beneficial aspects.

BRIEF DESCRIPTION OF THE DRAWING FIGURES

For a more complete understanding of the present invention and the advantages thereof, reference is now made to the following description taken in conjunction with the accompanying drawings in which:

FIG. 1 illustrates a D flip-flop being used to synchronize an asynchronous data stream;

FIG. 2a–b illustrate timing diagrams of conditions under which a metastable output may occur;

DETAILED DESCRIPTION OF THE PREFERRED EMBODIMENTS

The preferred embodiment of the present invention is best understood by referring to FIGS. 1–5 of the drawings, like numerals being used for like and corresponding parts of the various drawings.

Figure 1:
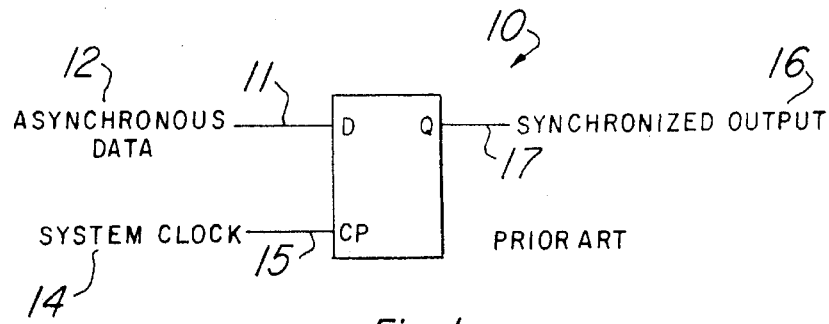

FIG. 1 illustrates the use of a D flip-flop to synchronous an asynchronous data stream. A D flip-flop 10 has a data input 11 receiving an asynchronous data stream 12. The output of a system clock 14 is also received by the clock input 15 of the D flop-flop 10. A synchronous output data output 16 is transmitted from the terminal 17.

In operation, the output 16 of the D flip-flop 10 is equal to the value of the asynchronous data stream 12 at the beginning of the clock pulse. In other words, the D flip-flop 10 outputs synchronized output data 16 which is equal to the asynchronous data stream 12 sampled at the system clock rate. The output of the D flip-flop 10 is valid after a specified time delay from the active edge of the clock pulse.

Figure 2A:
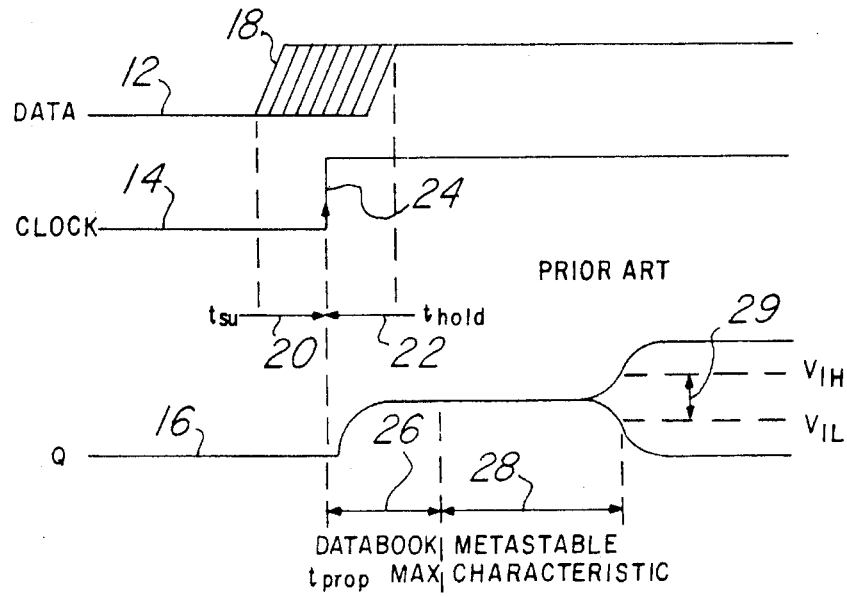
Figure 2B:
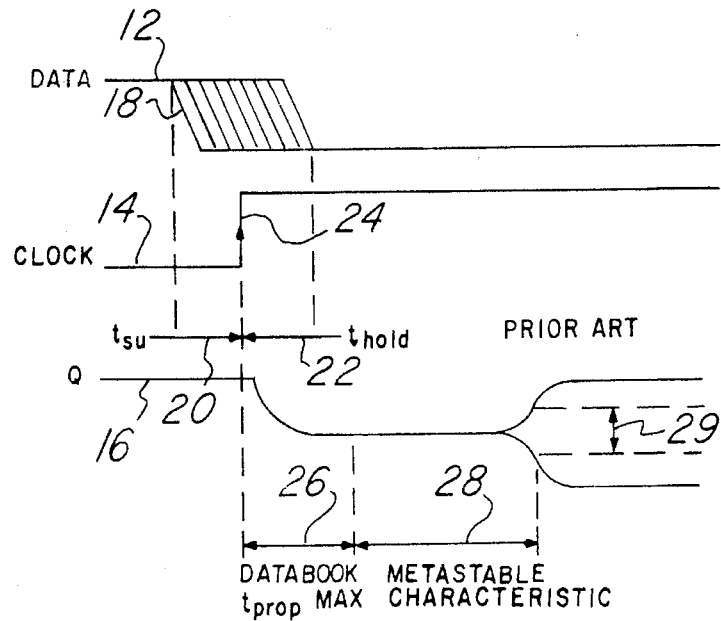

Referring now to FIG. 2a–b, the problem of metastability is illustrated. The metastability problem occurs when the asynchronous data stream 12 is undergoing a transition between two logic levels fails the set up or hold time constraints with respect to the active edge of the system clock 14. As shown in FIG. 2a, the data stream is undergoing a logic low to logic high transition. The shaded region 18 represents the time period during which the asynchronous data stream 12 has not settled into a valid logic level. In order to ensure a valid output, the input data must be stable at a valid logic level for a time period represented by the setup time 20 and hold time 22 requirements. The setup time requirement 20 represents the time prior to the active edge of the clock pulse 24 during which the input data should be stable at a valid logic level. The hold time 22 represents the time period during which the input data must remain stable after the active edge of the clock pulse 24.

If the input data is not stable between the setup and hold times 20 and 22, the value of the output 16 is uncertain. While the output 16 may lock into a logical high or logical low value, it may also "hang up" at a voltage in the metastable region which is neither a logical high nor a logical low. Under conditions in which the setup and hold requirements 20 and 22 are met, a valid output will appear after a propagation time delay 26. However, if the output hangs up in the metastable region, an additional metastable time delay 28 is necessary before the output 16 assumes a valid logic level. It should be noted that since asynchronous data stream 12 is being sampled at a point between logic levels, either a logical high or logical low output is valid. It should also be noted that while the metastable time delay characteristic represents a time during which most metastable signals will lock into either a high or low logic level in most cases, it would still be possible for the output to hang up for periods greater than the metastable time delay 28.

FIG. 2b illustrates a signal which violates the setup and hold requirements during a logic high to logic low transition. Once again, when the setup time requirement 20 and the hold time requirement 22 are not met, the output 16 may enter the metastable region. In most cases, the output 16 will lock into either a logic high or logic low level within a time indicated by the propagation time delay 26 and the metastable time delay 28.

Figure 3:
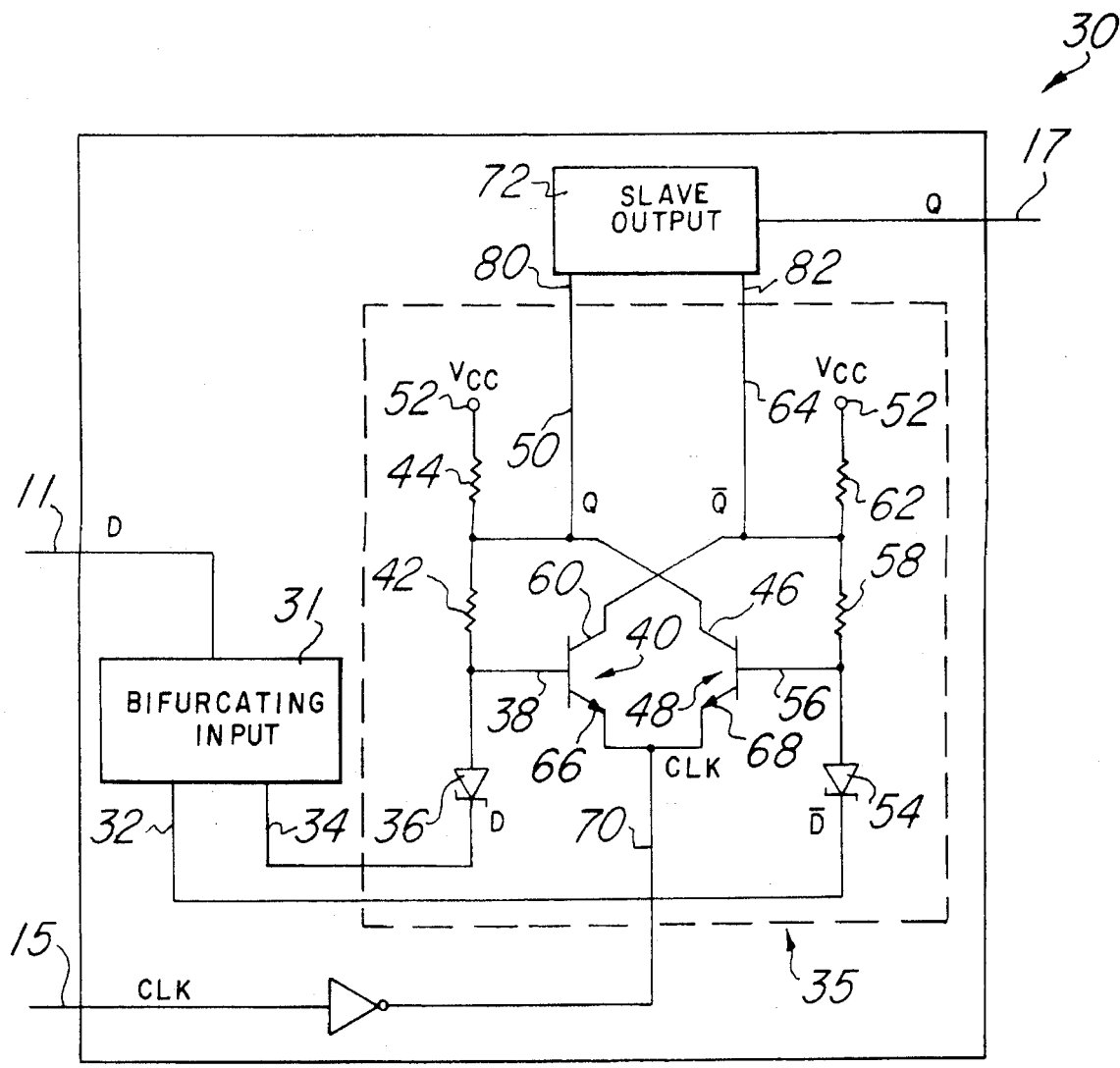
FIG. 3 illustrates a previously developed implementation of a flip-flop.

FIG. 3 illustrates a previously developed flip-flop circuit 30. The input 11 is connected to a bifurcating input section 31 which produces an inverted input 32 and non-inverted input 34, which are connected to a master latch section 35. The non-inverted input 34 is connected to the cathode of a first diode 36. The anode of the first diode 36 is connected to the base 38 of a first transistor 40 and to a resistor 42. The other lead of the resistor 42 is connected to a pullup resistor 44, the collector 46 of a second transistor 48, and a non-inverting output 50. The other lead of the pullup resistor 44 is connected to the power supply voltage, $V_{CC}$ 52.

The inverting input 32 is connected to a cathode of a second diode 54. The anode of the second diode 54 is connected to the base 56 of the second transistor 48 and to a resistor 58. The other lead of the resistor 58 is connected to the collector 60 of the transistor 40, to a pullup resistor 62 and to an inverting output 64. The other lead of the pullup resistor 62 is connected to the power supply voltage, $V_{CC}$ 52.

The emitters 66 and 68 of the transistors 40 and 48, respectively, are connected to an inverted clock 70, which is the inverted signal of the system clock 15. The non-inverted output 50 and inverted output 64 are connected to a slave latch output section 72. The system clock 15 is inverted in order to produce a falling edge in response to the active edge of the system clock. If the flip-flop is designed such that the falling edge is the active edge, no such inversion is necessary.

The master section 35 comprises a latching circuit for locking in the values of the inverted and non-inverted inputs 32 and 34 at the time of the clock pulse.

The slave output section 72 prevents false outputs from occurring when the inverted clock 70 is in a high state, by latching the outputs 50 and 64 at valid states. The slave output section can be implemented using two NAND gates, each having the output of the other as one input. The other inputs are supplied by the outputs 50 and 64 of the master section 35.

The resistor combinations 42 and 44, and 58 and 62, are proportioned to divide the power supply voltage in a desired ratio. The resistors 42 and 58 should not be so large as to prevent the collectors 46 and 60 from drawing current therethrough.

Under normal operating conditions, wherein the setup and hold time requirements are met, the input from the asynchronous data stream 11 is bifurcated into an inverted input 32 and a non-inverted input 34. Assuming, for illustration, that the input has a value of a logical 1, then the non-inverted input 34 has a logic high voltage and the inverted input 32 has a logical low voltage. Hence, the voltage at the base 38 of the first transistor 40 is substantially higher than the voltage at the base 56 of the second transistor 48. As the inverted clock signal 70 changes from a high to a low voltage, the first transistor 40 turns on when the voltage differential between the base 38 and the inverted clock signal 70 exceeds the base-emitter threshold voltage, $V_{be}$, of about 0.7 volts. Hence, if the base 38 is at 3.8 volts, the transistor 40 will turn on when the inverted clock 70 is at a voltage of 3.1 volts. The transistor 40 will conduct from collector 60 to emitter 66, drawing current away from the base 56 of the transistor 48. Thus, the second transistor 48 is prevented from turning on while the first transistor 40 is conducting.

The metastability problem occurs when the asynchronous data stream is undergoing a transition during the active edge of the system clock signal 15. If the inverted input 32 and non-inverted input 34 have an equal voltage as the: inverted clock signal 70 is decreasing, it is possible that both transistors 40 and 48 will turn on simultaneously. For example, if the bases 38 and 56 both have a voltage of 1.8 volts at precisely the time that the inverted clock signal 70 is at 1.1. volts, then both transistors will conduct simultaneously. Since neither transistor will be able to turn the other off, both inverted and non-inverted outputs 64 and 50 will have the same value, resulting in a metastable output. The transistors 40 and 48 will remain on until the system is perturbed by noise on one of the lines. At that point, one transistor will begin conducting more strongly than the other and will eventually draw enough current form the other transistor so as to turn the other transistor off.

The present invention prevents metastable conditions occurring at the master portion from affecting the slave portion. The invention can be better understood by the following conceptual example, as applied to the prior art latch of FIG. 3. Let $\Delta V_T$ be defined as the voltage difference between D and $\overline{D}$ to have valid switching i.e., no metastable condition for $\Delta D = |D - \overline{D}| \geq V_T$. In this condition, no metastable conditions exists, so the master will behave normally, and valid data will be clocked in and seen at the flip-flops output. If $D = \overline{D}$, i.e., ($\Delta D = 0$), and the master latch is clocked, transistors 40 and 48 will conduct simultaneously. Since the latch is symmetrical, and transistors 40 and 48 are matched, both will conduct equal currents. Therefore the collectors of 40 and 48 will both fall at the same time. Due to the equilibrium both transistors will not saturate, and the collectors of 40 and 48 will remain at some equal potential. Noise may cause this potential to vary causing the collectors of 40 and 48 to rise and fall in opposite phases over some voltage range and may eventually enter a valid condition.

There are two problems that can occur under these conditions. First, if transistors 40 and 48's collectors fall near the range of the threshold voltage level of the slave latch, a metastable occurrence is possible in the slave latch, and will be seen at the flip-flops output. Secondly, when 40 and 48 remain at some equal potential while the clock is low, 40 and 48 are in their active region of operation. Any noise on D and $\overline{D}$ could cause random switching of the master latch, and oscillation may result. If this should occur, metastable recovery time of the flip-flop would increase greatly. The length of time transistors 40 and 48 remain active varies and can be as long as the total length of time the $\overline{CLK}$ 70 remains low. The problem of violating setup and hold times can not be avoided, but if the master does go metastable without affecting the slave portion, the: user would receive valid data, and the troublesome problems occurring from metastability would be resolved as far as the system is concerned.

Figure 4:
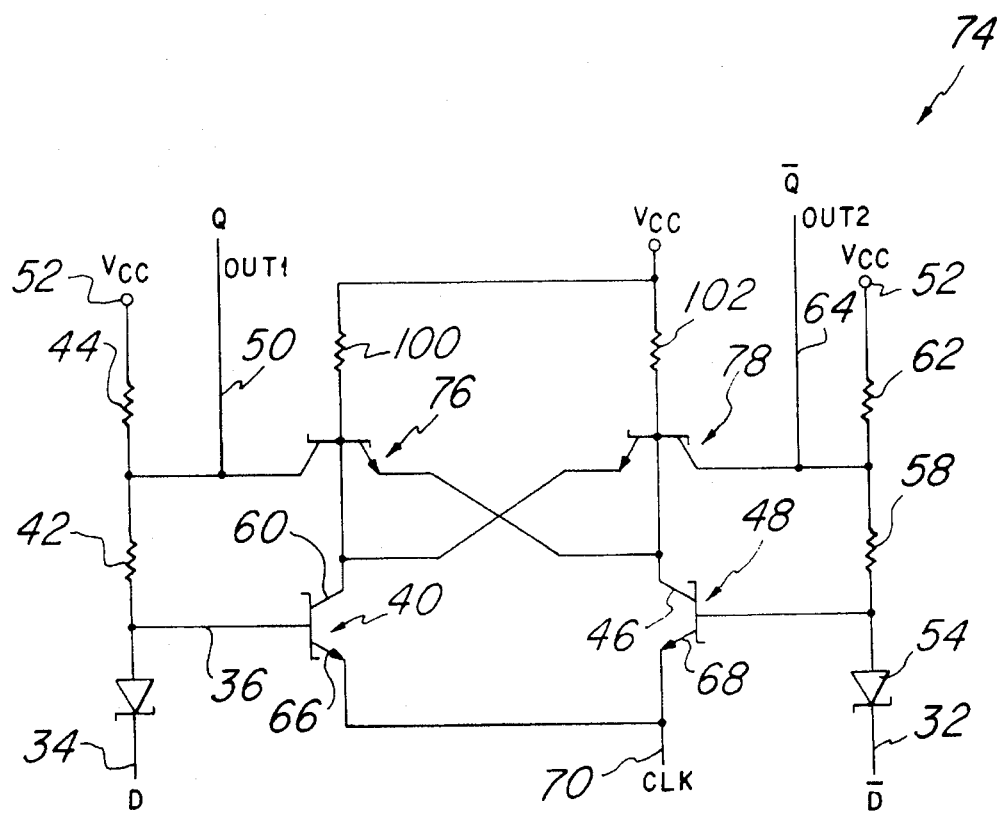
FIG. 4 illustrates the flip-flop of the present invention.
Figure 5:
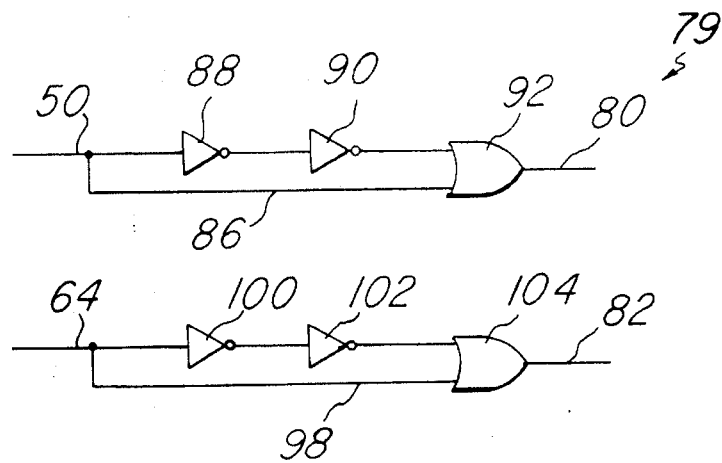
FIG. 5 illustrates a glitch removal circuit for use with the present invention.

Referring now to FIG. 4, a master section of a flip-flop in accordance with the present invention, which prevents the flip-flop from remaining in a metastable state, is illustrated. The master section 74 of the present invention has similar construction to the master section 35 of the D flip-flop 30 previously described in connection with FIG. 3, with the addition of transistors 76 and 78 coupled between the collectors of transistors 40 and 48 and resistors 100 and 102. As depicted, transistor 76 has its emitter connected to the collector of transistor 8 and to the base of transistor 78. The collector of 76 is provided as Q output 1. Transistor 78 has its emitter connected to the collector of transistor 40 and to the base of transistor 76. The collector of 78 is provided as the $\overline{Q}$ output 2. The respective bases of transistors 76 and 78 are also connected through pull up resistors 100 and 102 respectively to power supply voltage, $V_{CC}$ 52.

With this embodiment, oscillation problems are corrected in the following manner. If D=$\overline{D}$, i.e., (ΔD=0), the collectors of 40 and 48 will fall together as is known in the art. However in the present invention transistors 40 and 48 will both saturate, clamping their bases at the same voltage level. Since the collectors of transistor 40 and 48 are at equal potentials a $V_{be}$ cannot be generated across 76 or 78 and 76 and 78 will remain off. This holds output 1 and output 2 at a constant value. If noise is present on 40 and 48's bases, no oscillation can occur, due to 40 and 48 being clamped. This is a major advantage over the floating latch of FIG. 3. Note that the voltage at output 1 and output 2 will be equal, and will be set by the voltage dividers 44 and 42, 62 and 58. If we choose the resistors such that the voltage at output 1 and output 2 will not effect the slave latch, the flip-flop's output will remain fixed. Note that if ΔD=|D−$\overline{D}$|≥$V_T$, the metastable tolerant latch will operate normally and valid data will be seen at the output as in the regular floating latch.

The above discusses operation of the present inventive latch under two normal operational conditions, i.e., ΔD=|D−$\overline{D}$|≥$V_T$, and when ΔD=0. Another condition known to create metastable conditions is when ΔD=|D−$\overline{D}$|≥$V_T$; ΔD≠0. Referring again to FIG. 4, if D is greater than $\overline{D}$ by some small potential, 40 will begin to turn on earlier than 48 causing 40's collector to fall faster than 48's. This in turn will cause 76 to remain off, and output 1 voltage will remain at the potential determined by resistors 42 and 44. Since 76 is off, the feedback path from 48's collector through 76 and 40's base is broken and no oscillation in the latch can occur. This also holds true for the case when $\overline{D}$>D by some small potential. In the case where ΔD<$V_T$, ΔD≠0 the following should be considered. Say D is greater than $\overline{D}$ by some small potential. As before 40's collector will fall before 48's thereby shutting off 76. The problem occurs when D is greater than $\overline{D}$ by just the right amount to cause 40's collector to fall below 48's collector by a $V_{be}$, thereby tending to turn on 78, which connects and disconnects the collector of transistor 40 and the base of transistor 76 to output 2 and the base of transistor 48. This would cause output 2 to start to fall. If however, D is not greater than $\overline{D}$ by the right amount, 48 may begin to turn on and tend to turn off 78 which would cause output 2 to rise again. In simpler terms a glitch is generated. The minima of the glitch is determined by ΔD. It can be shown that the glitch can be removed by added circuitry. If we can remove this glitch, in the "eyes" of the slave latch, this is in effect the same as if the master did not go metastable, and no metastable occurrence will be seen at the output. To remove this glitch the circuit of FIG. 5 can be implemented. The glitch removal circuit depicted in FIG. 5 can be connected between respective outputs 50 and 64 of master portion 74 and respective input 80 and 82 of slave portion 72. Glitch removal circuit 79 includes OR gate 92 having one input adapted to receive the $\overline{Q}$ output of master portion 74, and another input having delay elements 100 and 102, such as inverters, serially connected to Q output 50. Similarly connected between $\overline{Q}$ output 64 of master portion 74 and input 82 of slave portion 72 is OR gate 104 having delay element 88 and 90 connected to one input and the other input connected directly to $\overline{Q}$ output 64.

Although the master section 74 of the present invention has been shown as an emitter-coupled cross latch, the invention works with any type latch which may assume an equilibrium state causing a metastable output.

TECHNICAL ADVANTAGES OF THE INVENTION

From the foregoing the construction of a flip-flop circuitry for preventing and correcting for the occurrence of metastable conditions has been disclosed. A technical advantage of the disclosed apparatus is that invalid metastable conditions can be prevented from propagating to the flip-flop output. This allows the flip-flop to hold steady until the next valid clock signal.

Another technical advantage of the invention is that the output stage of the master can be clamped during a metastable occurrence at a voltage level insufficient to affect the slave portion of a master-slave flip-flop configuration.

Another attendant advantage is that a valid output can be ensured after a definite time period, despite the occurrence of metastable conditions.

The present invention is applicable to all types of flip-flops, including TTL, ECL, MOS, CMOS, and other technologies, and can be used with other flip-flop configurations, such as R-S flip-flops.

While the present invention has been discussed in connection with a flip-flop, any circuit which uses a latch to lock in data values is subject to metastability problems. Memory cells, flip-flops, registers, discrete latches, and other devices are all subject to the metastability problems which may benefit from the present invention.

Although a preferred embodiment of the invention has been described in detail, it should be understood that various changes, substitutions and alterations can be made therein without departing from the spirit and scope of the invention as defined by the appended claims.

What is claimed is:

1. A flip-flop circuit comprising:

first and second transistors each having a control electrode and first and second current electrodes, each control electrode coupled to receive a respective input signal, said second current electrodes of said first and second transistors coupled to a clock; and first and second load transistors to compensate for metastable conditions on said flip-flop, each of said load transistors having a control electrode and first and second current electrodes, said control electrodes coupled to a reference voltage, the first current electrode of each of said first and second load transistors coupled to a respective first current electrode of one of said first and second transistors and coupled to the control electrode of the other load transistor, the second current electrode of each of said first and second load transistors coupled to an output and to a voltage divider network.

2. The flip-flop circuit of claim 1, wherein said first and second load transistors are schottky transistors.

3. The flip-flop circuit of claim 1, wherein said load transistors are bipolar transistors.

4. The flip-flop circuit of claim 1, further including a resistor coupling said first current electrode of said first load transistor to said reference voltage and a resistor coupling said second current electrode of said second load transistor to said reference voltage.

5. The flip-flop circuit of claim 1, wherein said voltage divider network comprises:

a first resistor coupling a reference voltage to said second current electrode of said first load transistor, to said output connected to said second electrode of said first load transistor and to a first terminal of a second resistor;

a first diode coupling a first input signal line to a second terminal of said second resistor and to said control electrode of said first transistor, said first input signal line receiving said respective input signal corresponding to said first transistor;

a third resistor coupling a reference voltage to said second current electrode of said second load transistor, to said output connected to said second electrode of said second load transistor and to a first terminal of a fourth resistor; and a second diode coupling a second input signal line to a second terminal of said fourth resistor and to said control electrode of said second transistor, said second input signal line receiving said respective input signal corresponding to said second transistor.

6. A flip-flop circuit comprising:

first and second transistors each having a control electrode and first and second current electrodes, one of said control electrodes being coupled to receive an inverted input signal and the other control electrode being coupled to receive a non-inverted input signal, said second current electrodes of said first and second transistors being coupled to a clock;

a first voltage divider connected to said control electrode of said first transistor and a second voltage divider connected to said control electrode of said second transistor; and first and second load transistors for connecting and disconnecting the first current electrode of one of said first and second transistors to a respective one of said first and second voltage dividers and to an output, said first and second load transistors each having a control electrode and first and second current electrodes, said control electrodes coupled to a reference voltage, the first current electrode of each of said first and second load transistors coupled to a respective first current electrode of one of said first and second transistors and coupled to the control electrode of the other load transistor, the second current electrode of each of said first and second load transistors coupled to an output and to one of said first and second voltage dividers.

7. A latch circuit comprising:

a first input and a second input;

first and second transistors each having a control electrode and first and second current electrodes, said control electrode of said first transistor coupled to said first input, said control electrode of said second transistor coupled to said second input, and said second current electrodes of said first and second transistor coupled to receive a clock signal; and third and fourth transistors each having a control electrode and first and second current electrodes, said control electrodes coupled to a reference voltage, the first current electrode of each of said third and fourth transistors coupled to a respective first current electrode of one of said first and second transistors and coupled to the control electrode of the other of said third or fourth transistor, the second current electrode of each of said first and second load transistors coupled to a respective output and to a voltage divider network, said third and fourth transistors connecting and disconnecting the first electrode of each of said first and second transistors to said respective output and to the control electrode of the other of said first and second transistors, said third and fourth clamping said outputs at a constant value in response to metastable conditions on said latch, said third transistor selectively coupling the first current electrode of said second transistor to the control electrode of said first transistor and to one of said outputs, said fourth transistor selectively coupling the first current electrode of said first transistor to the control electrode of said second transistor and to the other of said outputs.

8. The device of claim 7, wherein said third and fourth transistors are schottky transistors.

9. The latch circuit of claim 7, further including a resistor coupling said first current electrode of said third transistor to said reference voltage and a resistor coupling said second current electrode of said fourth transistor to said reference voltage.

10. The latch circuit of claim 7, wherein each said voltage divider network comprises:

a first resistor coupling the reference voltage to said second current electrode of said third transistor, to said output connected to said second electrode of said third transistor and to a first terminal of a second resistor;

a first diode coupling said first input to a second terminal of said second resistor and to said control electrode of said first transistor;

a third resistor coupling the reference voltage to said second current electrode of said fourth transistor, to said output connected to said second electrode of said fourth transistor and to a first terminal of a fourth resistor; and a second diode coupling said second input to a second terminal of said fourth resistor and to said control electrode of said second transistor.

11. A flip-flop circuit, comprising:

inputs to receive input signals;

first and second transistors each having a base, emitter and collector, the base of each transistor being coupled to one of said inputs, the emitters of said first and second transistors being coupled to each other and to a clock; and a third and a fourth transistor each having a base, emitter, and collector, said emitter of said third transistor being connected to said collector of said second transistor and said collector of said third transistor being connected to an output, said emitter of said fourth transistor being connected to said collector of said first transistor and said collector of said fourth transistor being connected to another output, the base of said third transistor being coupled to a supply voltage and to the collector of said first transistor, the base of said fourth transistor being coupled to a supply voltage and to the collector of said second transistor.

12. The flip-flop circuit of claim 11, wherein said third and fourth transistors hold said outputs at a desired output potential in response to concurrent conduction of said first and second transistors.

13. The device of claim 12, further including means connected to said first and second outputs for suppressing glitches present at said outputs.

14. The flip-flop circuit of claim 13, wherein said means for suppressing glitches present at the outputs includes first and second glitch removal circuits, said first glitch removal circuit connected to the output and said second glitch removal circuit connected to the another output.

15. The flip-flop circuit of claim 14, wherein the first and second glitch removal circuits each include an OR gate, a first input of the first glitch removal circuit OR gate connected to the output, a second input of the first glitch removal circuit OR gate serially connected to the output through at least one delay element, a first input of the another glitch removal circuit OR gate connected to the second output, and a second input of the another glitch removal circuit OR gate serially connected to the second output through at least one delay element.

16. The flip-flop circuit of claim 12, wherein said desired output potential is a valid logic level, said valid logic level being one of a high and a low logic level.

17. The flip-flop circuit of claim 11, further including a resistor coupling said emitter of said third transistor to said reference voltage and a resistor coupling said emitter of said fourth transistor to said reference voltage.

* * * * *